United States Patent [19]
Yun et al.

[11] Patent Number: 5,479,393
[45] Date of Patent: Dec. 26, 1995

[54] VIDEO RAM HAVING AN OPTION OF A FULL SAM AND A HALF SAM

[75] Inventors: Sun-Byeong Yun, Seoul; Jang-Kyu Lee; Chul-Kyu Lee, both of Suwon, all of Rep. of Korea

[73] Assignee: Samsung Electronics Co., Ltd., Suwon, Rep. of Korea

[21] Appl. No.: 262,760

[22] Filed: Jun. 20, 1994

[30] Foreign Application Priority Data

Jun. 19, 1993 [KR] Rep. of Korea ................. 1993-11242

[51] Int. Cl.$^6$ .................................................. G11C 8/00
[52] U.S. Cl. ............... 365/221; 365/189.02; 365/230.02; 365/230.04; 365/236; 365/239; 365/238.5
[58] Field of Search ..................... 365/221, 219, 365/189.01, 189.02, 230.02, 230.04, 236, 239, 238.5

[56] References Cited

U.S. PATENT DOCUMENTS

| | | | |
|---|---|---|---|
| 5,319,603 | 6/1994 | Watanabe et al. | 365/230.04 |
| 5,365,489 | 11/1994 | Jeong | 365/230.02 |
| 5,381,376 | 1/1995 | Kim et al. | 365/230.03 |

FOREIGN PATENT DOCUMENTS 57-15271  1/1982  Japan .

OTHER PUBLICATIONS

NEC Corporation, μPD482444, μPD482444, Feb. 21, 1994, pp. 1–60.
Texas Instruments, TMS55160, Aug. 1992, Revised Jan. 1993, pp. 7-1 to 7-55.

*Primary Examiner*—Viet Q. Nguyen
*Attorney, Agent, or Firm*—Cushman Darby & Cushman

[57] ABSTRACT

A video RAM device which is easily manufactured to be compatible with a video system, irrespective of the type of video RAM controller used in the system. The video RAM is freely changeable in a manufacturing step to operate as either a half SAM device or as a full SAM device to conform to the type of video RAM controller used or current demand of customers of video RAM devices, depending upon an internal addressing condition. The video RAM device includes a serial access memory (SAM) and a random access memory (RAM) each having interleaved groups of memory cells which are interleaved with respect to a serial output sequence from the SAM. A first interleaved group is represented by memory cells having an address with a most significant bit being at one logic level, and a second interleaved group is represented by memory cells having an address with a most significant bit being at an opposite logic level. The video RAM device also includes a serial counter for generating serial addresses, and a group of transfer gates for transferring data between the RAM and the SAM.

17 Claims, 7 Drawing Sheets

VIDEO RAM HAVING AN OPTION OF A FULL SAM AND A HALF SAM

BACKGROUND OF THE INVENTION

1. Field of the Invention

The present invention relates to a video RAM, and more particularly to a video RAM which can be freely selected during a manufacturing process of the chip to operate as a half SAM device or as a full SAM device.

2. Background of Related Art

Recently, with the rapid spread in the use of portable computers such as note book computers, video RAMS are being more widely used. Video RAMS are a dual port memory and therefore have both the function of a dynamic RAM (random access memory) and the function of a SAM (serial access memory), both functions operating asynchronously. Generally, the SAM has a very high data transfer rate. The dynamic RAM port is typically connected to a CPU of a computer system and the SAM port is typically connected to an external system such as a CRT (cathode ray tube) and/or a video camera, and as such has wide applications for various systems. In order to perform a variety of operational functions increasingly required by video RAMS, a higher data storage capacity is required. This necessitates an increase in the density of the video RAM.

According to the conventional data transfer method, a video RAM device either contains a full SAM or a half SAM. For instance, the video RAM identified as μPD48244S and manufactured by NEC Co. employs the full SAM, while the video RAM TMS55160 manufactured by Texas Instrument Company employs the half SAM. Furthermore, according to the type of SAM, a controller for controlling the SAM is also classified into a full SAM controller for controlling the full SAM or a half SAM controller for controlling the half SAM. The specific structures of the conventional full SAM and half SAM are briefly mentioned hereinbelow. In the following description, the column size of the RAM is 512, and the length of the RAM cell addressed can be various conventional lengths, i.e. 1 bit, 8 bits or 16 bits. Furthermore, the column size of the full SAM is 512, and of the half SAM is 256. However, the description is aptly suitable for all sizes of memory. Furthermore, the RAM column address bit lines (or internal address bit lines) are represented as Ai (where i=0, 1, 2, . . . 8) and the SAM column address bit lines (or serial address bit lines) are represented as SSi (where i=0, 1, 2, . . . 8).

FIG. 1 is a schematic block diagram showing a structure of a conventional video RAM device having RAM 300 and a full SAM 302. In this structure, the full SAM is divided into two parts in response to an column address bit line A8. The leading 256 bits from 0 to 255 correspond to a lower SAM and the following 256 bits from 256 to 511 correspond to an upper SAM, and are individually addressable by an internal counter according to a combination of column address bit lines A0–A7. The lower and upper parts of the full SAM are alternatively selected in dependence upon the column address bit line A8. Thus, data in the lower and upper parts of the RAM can be respectively transferred to the lower and upper parts of the full SAM. Commonly, a data transfer operation from the RAM to the SAM is performed primarily by a read transfer operation and thereafter by a split read transfer operation. During the split read transfer operation, data stored in the lower part of the full SAM is output to an external device such as a CRT and data stored in the upper RAM is transferred to the upper part of the full SAM. For example, in accordance with the RAM address bit line A8, during an initial read transfer operation, either the lower part of the full SAM or the upper part of the full SAM is selected to which data is to be transferred to in the following split read transfer operation. If a serial address bit line SS8 of a logic low level or "0" level is generated from an internal counter (not shown) during the read transfer operation and thereafter the split read transfer operation is performed, the data stored in the lower part of the full SAM is output to the external devices and the data stored in the upper RAM is transferred to the upper part of the full SAM. In the meantime, if the serial address bit line SS8 is generated at a logic high level or "1" level by the internal counter, the data stored in the upper part of the full SAM is output to the external devices and the data stored in the lower RAM is transferred to the lower part of the full SAM during the split read transfer operation. Consequently, in the full SAM device since the number of data bits in the RAM is the same as the number of data bits of the SAM, the data stored in the full SAM device is transferred all at once during the data transfer operation. Such a full SAM is disclosed in a paper "A 256K Dual Port Memory" of ISSCC (published in 1985).

FIG. 2 is a schematic block diagram showing a structure of a conventional video RAM device having RAM 300 and a half SAM 304. In this structure, the RAM associated with the half SAM is divided into two blocks B1 and B2, each block B1, B2 being equal in memory size to the SAM unlike the RAM of FIG. 1 which had two blocks which were each the size of only half of the full SAM. The respective blocks B1, B2 are divided again into upper and lower parts. Consequently, the RAM associated with the half SAM device is divided into four smaller blocks. In addition, the half SAM is divided into two parts in accordance with the address bit lines A0 to A6. The leading 128 bit addresses from 0 to 127 correspond to the lower part of the half SAM and the succeeding 128 bits from 128 to 255 correspond to the upper part of the half SAM. In summary, the RAM is divided into two blocks B1 and B2 according to the address bit line A8 and the respective blocks B1, B2 are divided again, according to the address bit line A7, into upper and lower parts for the transfer operation of the half SAM. At an initial read transfer operation, RAM address bit lines A7 and A8 select a given block in the RAM of which data is to be transferred to the lower or upper part of the half SAM in next cycle of the split read transfer operation. Address bit line A8 selects the block B1, B2 and address bit line A7 selects the upper or lower part of the respective block B1, B2. If the block B1 is selected by the RAM address bit line A8 being at a low logic level and when serial address bit line SS7 is at a low logic level by the internal counter, the data stored in block B1 of the RAM is transferred to the lower part of the half SAM. However, if the serial address bit line SS7 is at a high logic level, the data stored in block B1 of the RAM is transferred to the upper part of the half SAM. Similarly, if the block B2 is selected according to the RAM address bit line A8 at a high logic level and the serial address bit line SS7 is at a high logic level by the internal counter, the data stored in block B2 of the RAM is transferred to the upper part of the half SAM. In the next cycle, if the serial address bit line SS7 is at a low logic level, the data stored in block B2 of the RAM is transferred to the lower part of the half SAM. It is noted from the above description that in the full SAM device the RAM address bit line A8 is a "don't care" for addressing purposes and that the RAM address bit line A7 is used as an address input. On the contrary, however, in the half SAM device the RAM address bit line A8 is used as an address input and the RAM address bit line A7 is a "don't care" for addressing purposes.

Additionally, as described above, the conventional half SAM controller is not compatible with the full SAM device and conversely the conventional full SAM controller is not compatible with the half SAM device. Thus, a conventional half SAM device cannot be used together with a full SAM device in a same system comprising video RAM. Accordingly, there is a problem in that the video RAM must exclusively employ full SAM devices or half SAM devices, but not a combination of full SAM and half SAM devices. Thus, a manufacturer must design separate video RAM devices, one type having a full SAM and another type having a half SAM, since the addressing methods thereof are different from each other. The difference in conventional designs between video RAM devices employing full and half SAM's raises costs, design time and time required for manufacturing products using video RAM devices.

SUMMARY OF THE INVENTION

It is therefore an object of the present invention to provide a video RAM device having a design which is compatible with various system designs irrespective of the type of video RAM controllers used in the system.

It is another object of the present invention to provide a video RAM device which is freely changeable, at least in a manufacturing process, to operate as a half SAM device or as a full SAM device.

It is still another object of the present invention to provide a low cost video RAM device by providing a SAM which is readily inter-changeable between a full SAM and a half SAM.

It is still yet another object of the present invention to provide a video RAM which is freely changeable to operate as a half SAM device or as a full SAM device, even after completion of manufacture of the device.

It is further still another object of the present invention to provide a video RAM device which is readily changeable between a full SAM and a half SAM device in dependence upon an internal addressing condition, irrespective of an addressing condition of a system.

A video RAM according to the present invention has a cell array arrangement selectively changeable to operate as either a full SAM or a half SAM device according to a coding condition of addresses received from the external system.

According to an aspect of the present invention, a video RAM having RAM and SAM includes a serial counter which counts fully for operation as a full SAM and to half its full count value for operation as a half SAM.

According to another aspect of the present invention, a video RAM device has RAM which is addressably selected between a first group of unit cell arrays sequentially arranged and selected according to a combination of the most significant address bit of a first logic level, and a second group of unit cell arrays each being interleaved with the unit cell arrays of the first unit cell array group and selected according to a combination of the most significant address bit of a second logic level. The device further includes a serial counter which generates serial addresses, a SAM which has memory cell arrays being addressed in association with the first and second unit cell array groups, and a group of transfer gates for transferring data between the first and second unit cell array groups of the RAM and the SAM.

According to still another aspect of the present invention, a video RAM device includes an address switching control circuit connected in an address input path, for exchangeably transferring a most significant address bit with a next most significant address bit. This transfer operation determines the operation of the device as a full SAM device when the switching control circuit is switched in a first direction, and for operation as a half SAM device when switched in a second direction.

BRIEF DESCRIPTION OF THE DRAWINGS

The above and other objects, advantages and features of the present invention will be more apparent from the following detailed description taken with the attached drawings, in which.

DETAILED DESCRIPTION OF THE PREFERRED EMBODIMENTS

Figure 1:
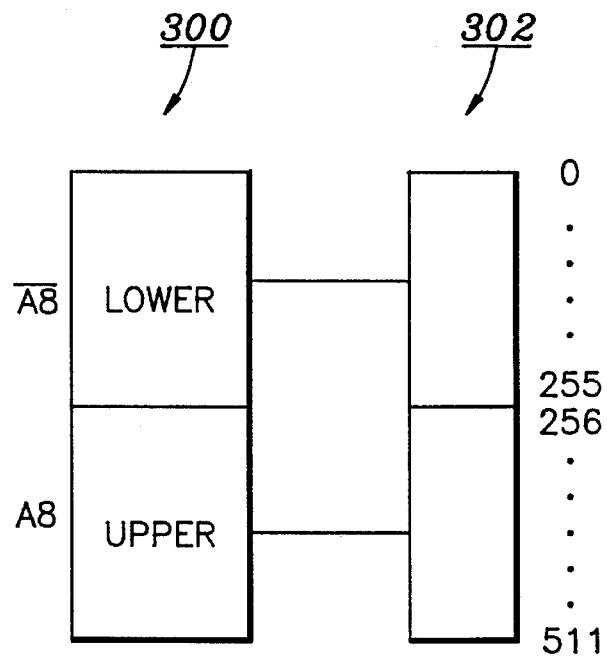
FIG. 1 is a view showing a data transfer diagram between a full SAM and a RAM according to a conventional video RAM device in the prior art.
Figure 2:
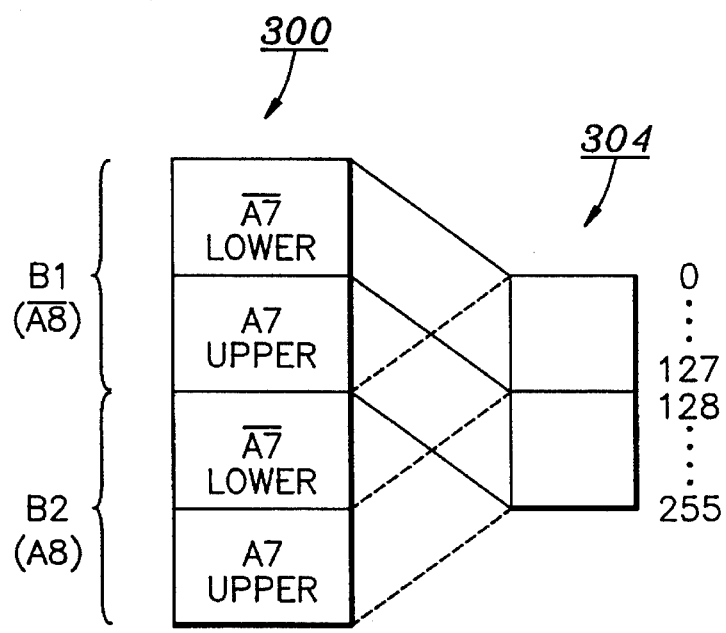
FIG. 2 is a view showing a data transfer diagram between a half SAM and a RAM according to a conventional video RAM device in the prior art.

The preferred embodiments of the present invention will now be explained hereinbelow in conjunction with the accompanying drawings in which like reference numerals represent like elements or equivalents thereof. Furthermore, in the following descriptions, an address coding condition, a number of column addresses, a number of bits corresponding to one row of the RAM, and a structure of an address pin switching control circuit are specifically described by way of example, to bring a better understanding of the present invention. It is to be understood, however, that a person skilled in the art can implement the invention by simple modifications to specific details presented in the descriptions thereof without departing from the scope or spirit of the invention.

Throughout the specification, a term "interleave" is used for defining an insertion of a third object between two and is intended to extend to alternately inserting objects among a number of objects which are sequentially arranged. Furthermore, address bit line A8 represents a most significant bit (MSB) of the input addresses A0–A8 due to the size of the video RAM described herein. However, this bit line may and will change according to a most significant bit if the invention is practiced with larger memory.

Figure 3:
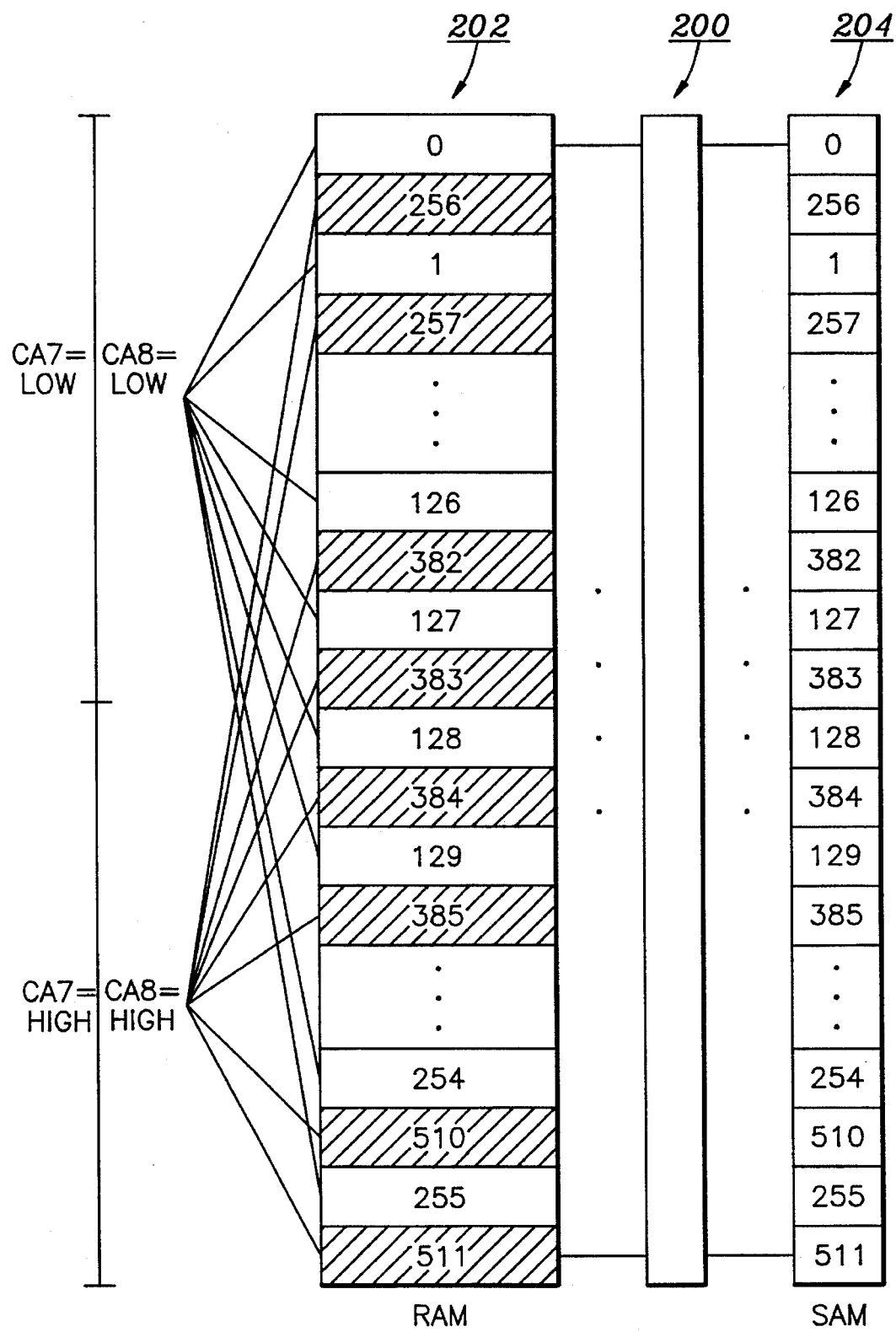
FIG. 3 is a block diagram showing a video RAM device which is readily changeable to operate as a full SAM device or as a half SAM device according to an embodiment of the present invention.

FIG. 3 is a block diagram showing a video RAM device showing RAM 202, SAM 204, and transfer gates 200 which is readily changeable to operate as a full SAM device or a half SAM device according to an embodiment of the present invention, wherein an arrangement of memory cell arrays is illustrated. In general, memory on a semiconductor integrated circuit device is comprised of a number of sub-cell memory arrays which increase in number as the density of the semiconductor integrated circuit device increases. In this structure, a video RAM device according to the present invention includes column address groups each comprised of a number of column address bit lines for addressing a first direction of a column direction of the RAM. Only CA7 and CA8 are shown in FIG. 3, while CA0 to CA6 (not shown) are used for addressing the respective unit memory cells. The structure further includes a first group of unit RAM cell arrays 0–255 each being sequentially arranged and selectable according to a combination of the address bit line CA8 at a "low" level and the rest of the column addresses bit lines CA0–CA7 and a second group of unit RAM cell arrays 256–511 each being interleaved with the unit RAM cell arrays 0–255 and selectable according to a combination of the address CA8 at a "high" level and the rest of the column address bit lines CA0–CA7. It is noted from the structure of FIG. 3 that the RAM and the SAM are specifically arranged according to a coding condition of the column addresses. For instance, the column address group is arranged in the order of addresses 0, 256, 1, 257, 2, . . . etc.

Now, if the column address is nine bits wide, the number of cell array columns arranged in the RAM and the SAM is $2^9=512$, as is shown in the embodiment of FIG. 3. As mentioned above, the cell arrays addressed at 0–255 are interleaved with the cell arrays addressed at 256–511, both in the RAM and in the SAM. Meanwhile, in such a structure, the RAM is divided into two blocks by means of the column address coding implemented in dependance upon the logic state of the column address bit line CA7. Furthermore, the coding of the respective columns divided into the two groups is implemented according to the logic state of the address bit line CA8. As a result, the columns are arranged in the address order of 0, 256, 1, 257, . . . , 510, 255, 511. Moreover, the SAM has the same address structure as that of the RAM. Under such a structure of the RAM and the SAM, the video RAM device according to the present invention selectively operates with a full SAM structure or with a half SAM structure. Meanwhile, a serial counter (not shown) receiving the column addresses generates serial addresses to be provided to the SAM. If the SAM operates as a full SAM, the serial counter counts all of the column address bits CA0–CA8. If the SAM operates as a half SAM, the serial counter counts all of the column address bits CA0–CA7 except for the column address bit line CA8, representing the most significant bit. Therefore, the SAM device according to the present invention operates selectively as a full or half SAM device according to the counting operation of the serial counter.

Figure 4:
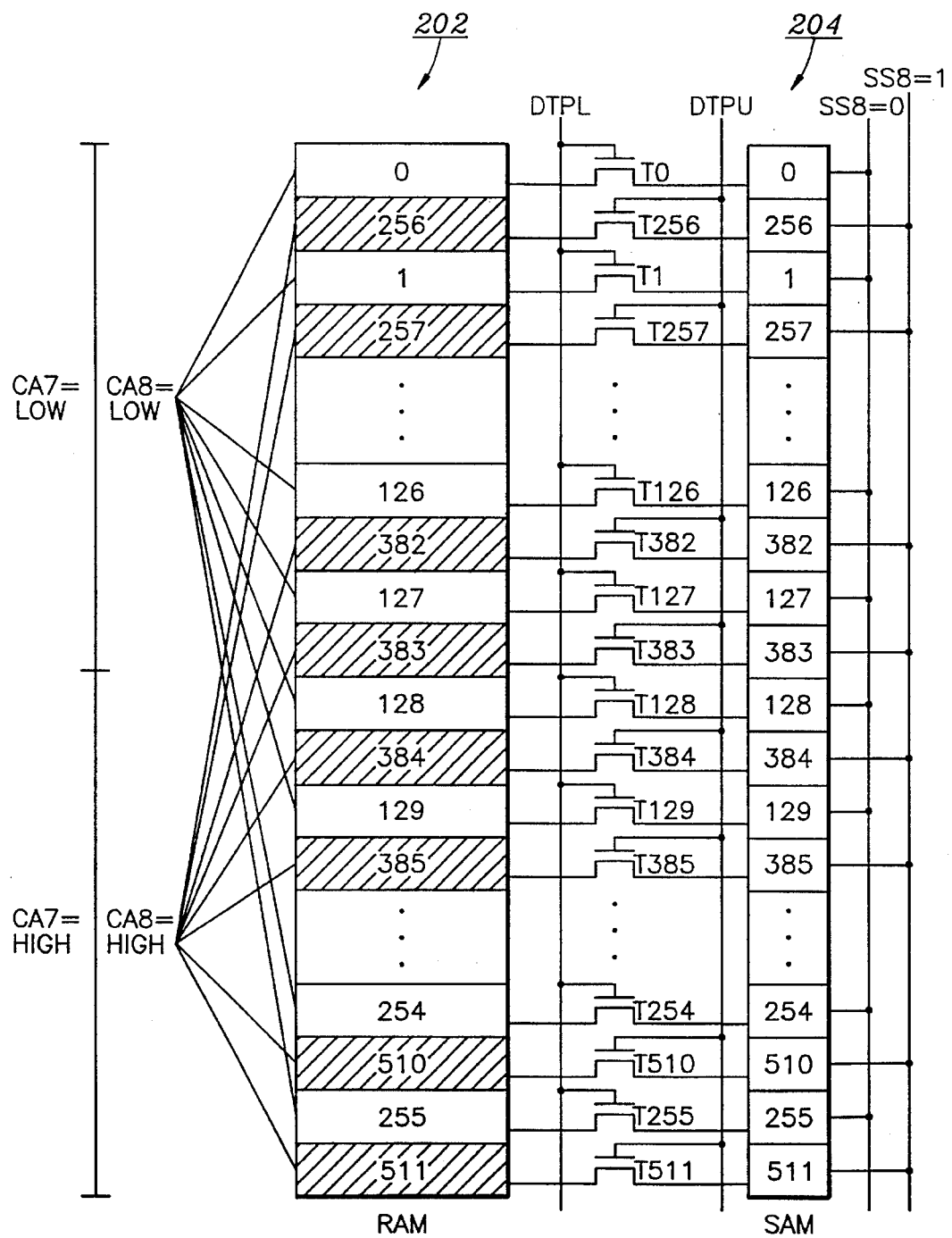
FIG. 4 is a view showing how transfer gates transfer data between a RAM and a SAM, when the video RAM device of FIG. 3 operates as a full SAM device.

FIG. 4 shows how transfer gates transfer data between the RAM 202 and the SAM 204, when the SAM operates as a full SAM. In FIG. 4, in order to allow the SAM to operate as a full SAM, a first group of transfer gates T0, T1, . . . , T255 connected in common to a lower SAM control signal DTPL is interleaved with a second group of transfer gates T256, T257, . . . , T511 connected in common to an upper SAM control signal DTPU. The transfer gates respectively connect the columns of the SAM with the corresponding columns of the RAM having the same column addresses. That is, the SAM and the RAM representing the column address bit line CA8 at a "low" level are connected to the transfer gates T0, T1, . . . , T255 and commonly controlled by the lower SAM control signal DTPL, while the SAM and the RAM representing the column address bit line CA8 at a "high" level are connected to transfer gates T256, T257, . . . , T511 and commonly controlled by the upper SAM control signal DTPU. Meanwhile, SAM input/output lines (not shown) are connected to the SAM and output data originally stored in the RAM to the exterior from the lower SAM when the serial address bit line SS8 is at a "low" level or the upper SAM when the serial address bit line SS8 is at a "high" level. In such a full SAM structure, data is transferred to the SAM according to the coding condition of the column addresses for the transfer operation of the full SAM and is performed with functional result as that of the conventional art device.

Figure 5:
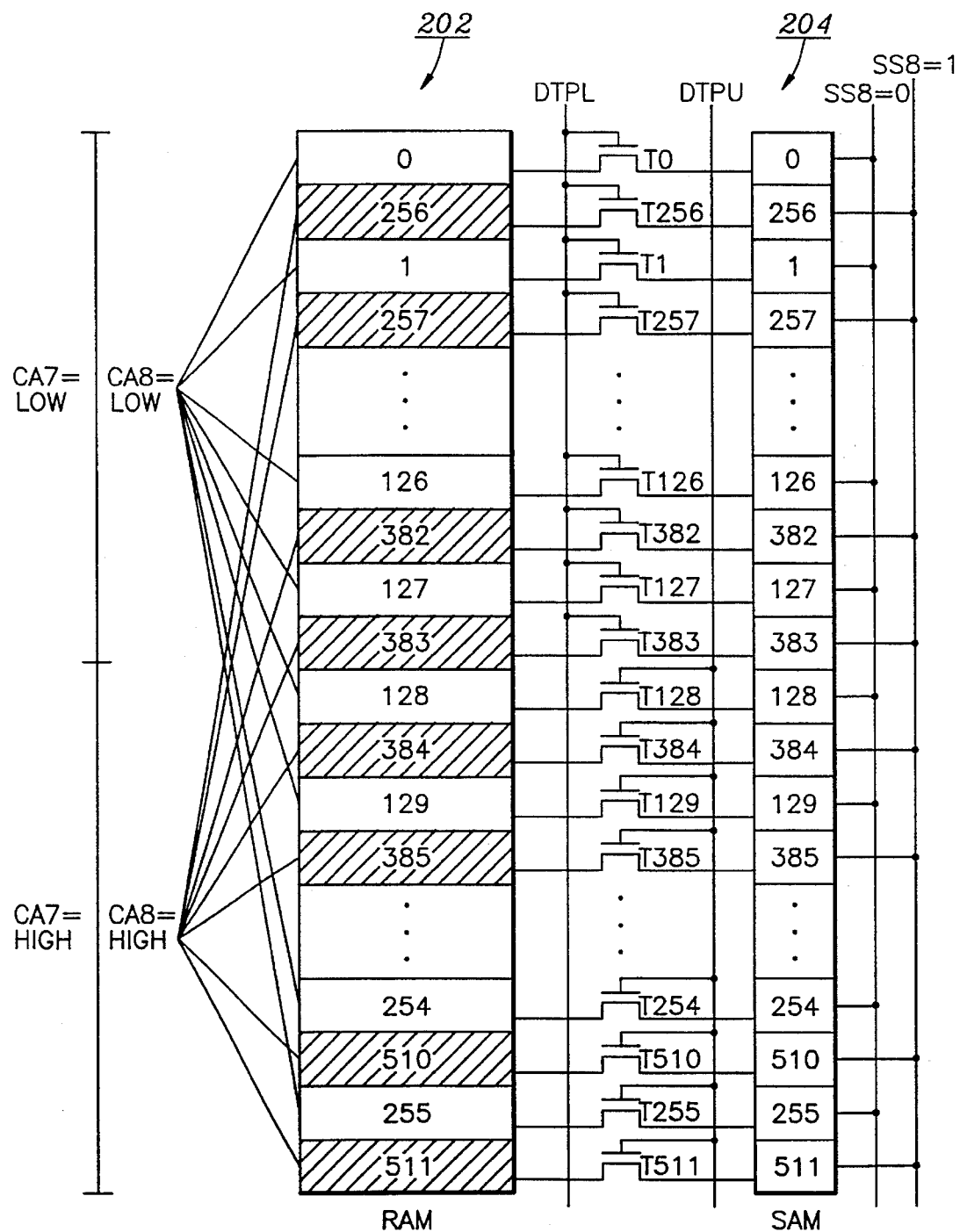
FIG. 5 is a view showing how transfer gates transfer data between a RAM and a SAM, when the video RAM of FIG. 3 operates as a half SAM device.

FIG. 5 shows how the transfer gates transfer data between a RAM and a SAM, when the video RAM device operates as a half SAM. In the drawing, the half SAM structure is implemented by simply changing the connections between the control signals DTPU, DTPL and the transfer gates T0, T256, T1, . . . , T511. Such a structure is accomplished by changing the connection of the control signals DTPL and DTPU, wherein the transfer gates connected to the columns selected when the column address bit line CA7 is at a "low" level are connected to the signal DTPL, and the transfer gates connected to the columns selected when the column address bit line CA7 is at a "high" level are connected to the signal DTPU. In more detail, the signal lines for transferring the control signals DTPL and DTPU are generally made of metal lines or poly-layer lines. On the signal lines, extra metal lines are additionally formed so as to allow the SAM to optionally operate as a full SAM as shown in FIG. 4 or as a half SAM as shown in FIG. 5 by selectively cutting off transfer gate connections to the signal lines in a manufacturing process. Namely, the two signal lines DTPL and DTPU are each connected to each of the transfer gates T0, T256, T1, . . . , 511, and fuses are connected between each of the signal lines DTPL and DTPU and the respective transfer gates. In the selection process, one of the signal lines DPTL and DPTU are selectively disconnected from each of the corresponding transfer gates by cutting off the respective fuses. In this way, the desired connections between the transfer gates and the controlling signal lines DTPL and DTPU can be readily made to be as shown in FIGS. 4 and 5.

The fuses may be cut electrically using known conventional technology for cutting fuses such as is found in conventional programmable read-only-memory (ROM), or cut manually by, i.e., laser trimming. Furthermore, the signal lines DPTL and DPTU may be selectively isolated from respective transfer gates by electrical isolation techniques which are not permanent, such as by a transistor found in the path between the signal lines and each of the transfer gates. The transistors can then be selectively controlled to changeably select between a configuration for operation as a half SAM device and a configuration for operation as a full SAM device.

The transfer operation of the half SAM will be explained in conjunction with FIG. 5. In FIG. 5, the control signals DTPU and DTPL are both enabled during a normal transfer operation, thereby performing the transfer operation of the full SAM over 512 bits. At this moment, the SAM can be accessed in halves under the control of the serial address bit line SS8 in the transfer cycle. That is, if the serial address bit line SS8 is at a "low" level, the input/output lines corresponding to the upper SAM are disabled, to prevent data stored in the upper SAM from being output. Furthermore, when operating as a half SAM device, only the serial address bit lines SS0–SS7 are required. Thus, the internal serial counter for the full SAM has the serial address bit line SS8 disabled and the column address bit line CA8 is substituted for the serial address bit line SS8. Therefore, the data stored in the upper and the lower SAMs is output according to the logic level of the serial address bit line SS8, and thus the half SAM data transfer operation is performed.

As mentioned above, extra metal lines are formed on the signal lines for transferring the SAM control signals, so that the SAM can selectably operate as a full SAM device or as a half SAM device according to a selective cutting or isolation of the metal lines.

Figure 6:
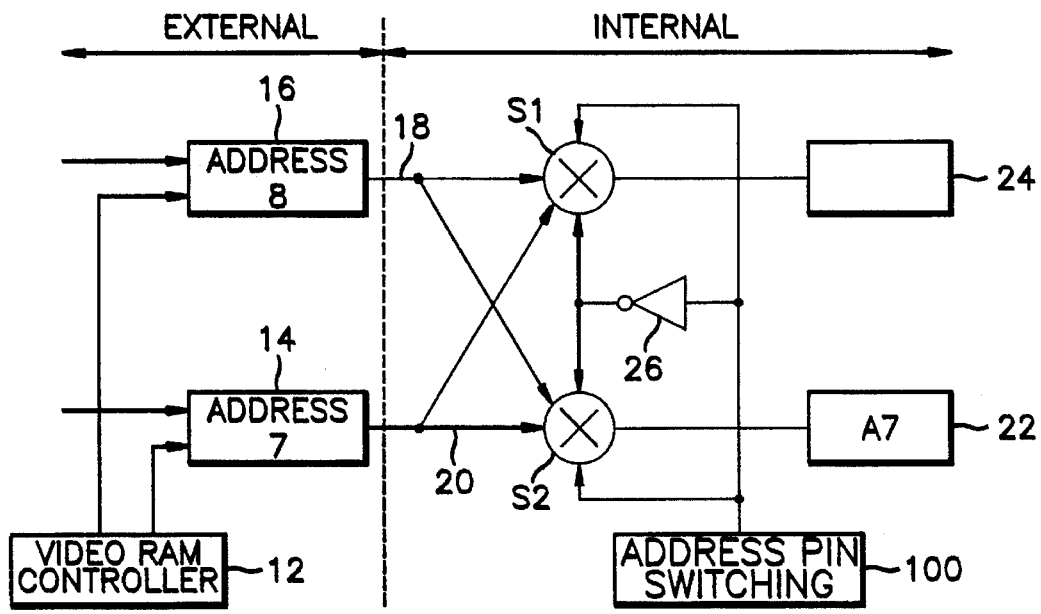
FIG. 6 is a schematic view showing a video RAM device which is readily changeable to operate as a full SAM device or as a half SAM device wherein an address pin switching control circuit is connected to address input terminals, according to an embodiment of the present invention.

FIG. 6 shows a video RAM device which is readily changeable to operate as a full SAM device or as a half SAM device wherein an address pin switching control circuit is provided connected to address input terminals, according to an embodiment of the present invention. In FIG. 6, the video RAM device according to the present invention includes an address pin switching control circuit 100 as control means for differently performing the address coding in accordance with the type of video RAM controller 12 of the external system. In the following description of the structure, a term "external" represents the system outside of the video RAM device with which the video RAM device operates, and a term "internal" represents internal portions of the video RAM chip. Reference numerals 14 and 16 respectively represent address pins of the video RAM device for receiving external address bits 7 and 8. Furthermore, reference numerals 22 and 24 respectively represent address bit lines A7 and A8, each received from the address pins 14 and 16, to be transferred to an internal address buffer (not shown). The external video RAM controller 12 controls the addresses of the video RAM device. Lines 18 and 20 are paths between the address pins 16 and 14 and the RAM address bit lines A8 and A7. Switching elements S1 and S2 connect the address pins 16 and 14 respectively to the RAM address bit lines A8 and A7 in response to the output of the address pin switching control circuit 100. Alternatively, the address pins 16 and 14 can be crossly connected to the RAM address bit lines A7 and A8, respectively, if the switching elements S1 and S2 perform an exchange switching operation in response to the output of the address pin switching control circuit 100. An inverter 26 inverts the output of the address pin switching control circuit 100 to supply the output thereof to the switching elements S1 and S2. Therefore, if the video RAM device having the address pin switching control circuit 100 is used as a half SAM device, the address pin 16 is connected to the RAM address A7 and the address pin 14 is connected to the address bit line A8, thereby performing the operation of a half SAM device. In that case, as mentioned above, the address bit line A7 is a "don't care" address bit and the address bit line A8 is used as an input address. However, if the video RAM device having the address pin switching control circuit 100 is used as a full SAM device, the address pin 16 is connected to the RAM address bit line A8 and the address pin 14 is connected to the RAM address bit line A7, thereby performing the operation of a full SAM device. In this case, as mentioned above, the address bit line A7 is used for the input address and the address bit line A8 is a "don't care". It can be noted from FIG. 6 that the SAM can be readily switched to be a full SAM or a half SAM by simply changing the connections of the address pins 14 and 16 without altering the addressing method of the controller of the video RAM.

Figure 7:
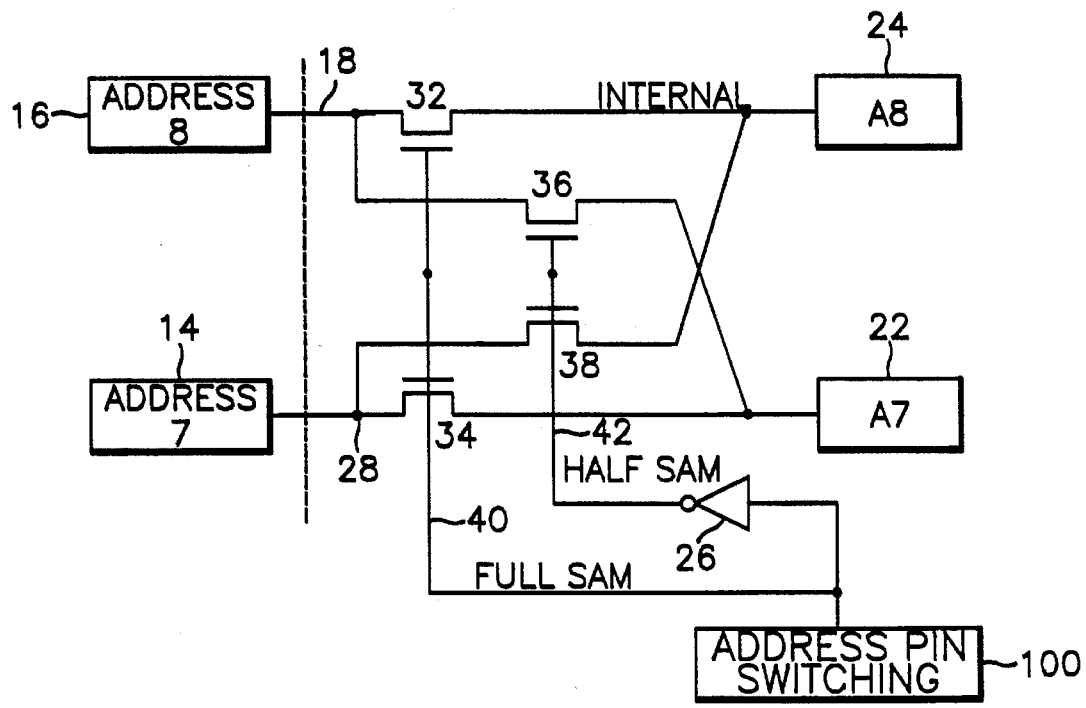
FIG. 7 is a view showing a detailed diagram of FIG. 6 with a preferred embodiment of switching elements S1 and S2 of FIG. 6.

Referring to FIG. 7, the switching elements S1 and S2 for switching the paths between the address pins and the internal address buffers can be implemented by using MOS transistors. For instance, an output line 40 of the address pin switching control circuit 100 is connected to gates of switching transistors 32 and 34 for use as a full SAM device. The switching transistor 32 has a channel connected between the line 18 and the address bit line A8, and the switching transistor 34 has a channel connected between the line 20 and the address bit line A7. Furthermore, an output line 42 of the inverter 26 is connected in common to gates of switching transistors 36 and 38 for the half SAM. The switching transistor 36 has a channel connected between the line 18 and address bit line A7, while the switching transistor 38 has a channel connected between the line 20 and address bit line A8. With such a circuit, since the lines 40 and 42 have complementary signals to each other, the transistors 32 and 34 for the full SAM device and the transistors 36 and 38 for the half SAM device are complementarily turned on and turned off. Thus, the address inputs through the addresses pins 14 and 16 can be freely exchanged within the video RAM device in accordance with the output of the address pin switching control circuit 100 upon the desire of the user. Of course transistors 32, 34 and transistors 36, 38 may be implemented as NMOS and PMOS transistors, respectively, and vice versa, obviating the need for the inverter 26.

Figure 8A:
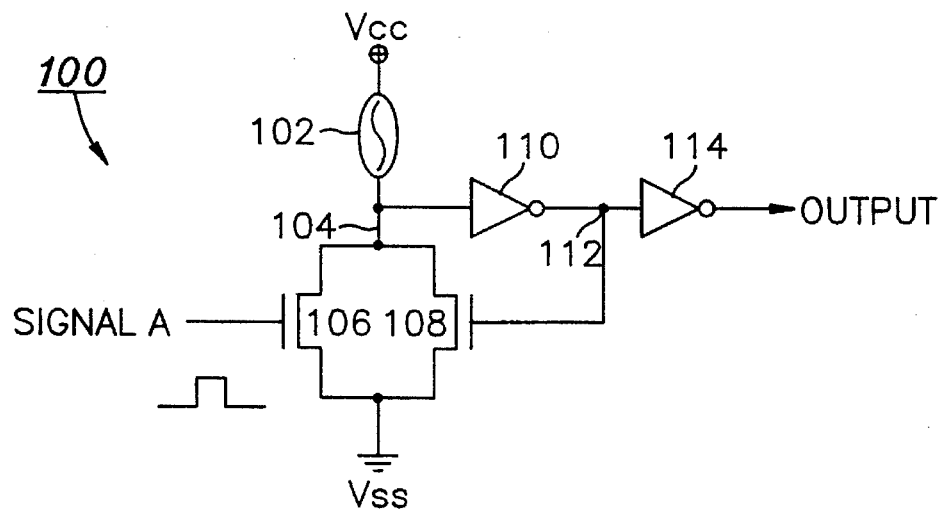
FIG. 8A is a detailed address pin switching control circuit of FIG. 6 according to an embodiment of the present invention.

Referring to FIG. 8A, the address pin switching control circuit 100 can be embodied using a fuse 102. The fuse 102 is not cut off for a video RAM device having the structure of a full SAM device and is cut off for a video RAM having a structure of a half SAM. In detail, the fuse 102 is connected between the power supply voltage Vcc and a connection node 104. Inverters 110 and 114 are serially connected to the connection node 104. The output signal of the inverter 114 corresponds to the output of the address pin switching control circuit 100. Furthermore, driving transistors 106 and 108 are formed in parallel between the connection node 104 and the ground Vss in order to discharge the voltage charged thereon. A driving signal A is provided to a gate of the driving transistor 106. A gate of the driving transistor 108 is connected to a connection node 112 connected to an output terminal of the inverter 110. With this type circuit, whether the video RAM device operates as a full SAM or as a half SAM is determined by whether or not the fuse 102 is cut off.

Figure 8B:
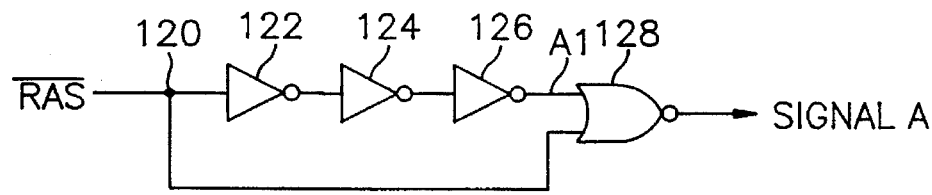
FIG. 8B is a circuit for generating a driving signal A shown in FIG. 8A.

FIG. 8B is a circuit for generating the driving signal A. The circuit is comprised of a connection node 120 to which a row address strobe $\overline{RAS}$ is applied, inverters 122, 124, and 126 serially connected to the connection node 120, and a NOR gate 128 for receiving a signal A1 output from the inverter 126 and the row address strobe $\overline{RAS}$ to generate the driving signal A. The number of inverters to be connected to the connection node 120 are determined by considering the switching time of the switching transistor 106. The faster the switching time of the switching transistor 106, the fewer inverters are required.

Figure 8C:
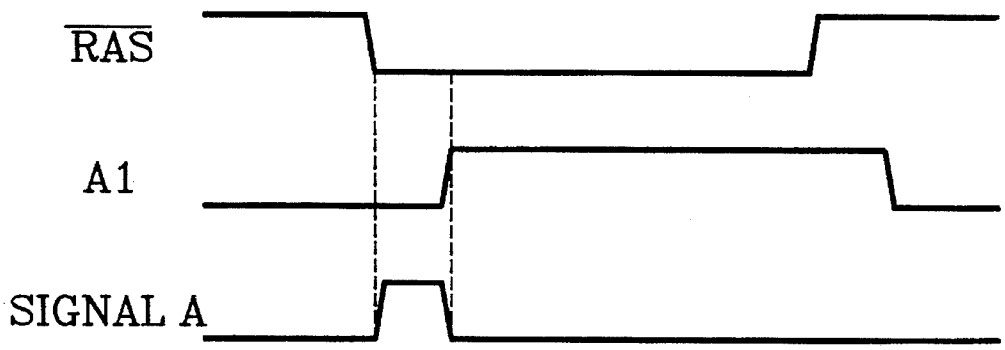
FIG. 8C is an operating timing diagram of the circuit shown in FIG. 8B.

FIG. 8C is an operation timing diagram for the circuit of FIG. 8B. As shown in FIG. 8C, if the row address strobe signal $\overline{RAS}$ is enabled to the "low" logic state, a short pulse driving signal A having a short pulse to the "high" logic state is generated by the specific time delay between the $\overline{RAS}$ signal connected directly to the NOR gate 128 and the same signal passed through a predetermined number of inverters 122, 124, 126 and connected to the NOR gate 128.

Referring to FIGS. 8A to 8C, the operation of the full SAM and the half SAM of FIG. 7 will be explained hereinbelow. First, if the video RAM device is structured and is operable as a full SAM device, the fuse 102 is left intact without being cut off. Then, the connection node 104 is charged to the "high" level upon power-up of the video RAM device. Therefore, the output signal of the inverter 114 is kept at a "high" logic level. The short pulse driving signal A is at a "high" level for a short time if a row address strobe $\overline{RAS}$ of the active "low" state is input, and is applied to the driving transistor 106. However, although the short pulse driving signal A is input, the fuse 102 is intact and therefore the input to inverter 110 remains at a high level which leads to the signal output of the inverter 114 being kept at the "high" level. Then, the switching transistors 32 and 34 for the full SAM are turned on and the switching transistors 36 and 38 for the half SAM are turned off. Accordingly, the external address pin 16 is connected to the internal address bit line A8 and the external address pin 14 is connected to the internal address bit line A7, thereby performing the operation of the full SAM device.

Figure 9A:
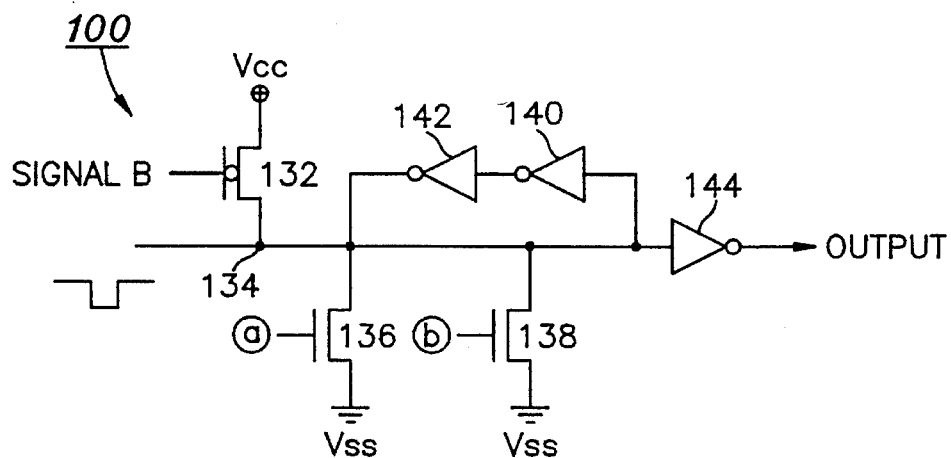
FIG. 9A is a detailed address pin switching control circuit of FIG. 6 according to another embodiment of the present invention.

On the contrary, if the fuse 102 is cut off or opened, the video RAM device has the structure of a half SAM device. Then, the connection node 104 is insulated from the power supply voltage Vcc. Thus, if the short pulse driving signal A is generated, the signal output from the address pin switching control circuit 100 goes to the "low" level. As a result, the switching transistors 32 and 34 for operation as a full SAM device are turned off and the switching transistors 36 and 38 for operation as a half SAM device are turned on. Accordingly, the external address pin 16 is connected to the internal address bit line A7 and the external address pin 14 is connected to the internal address bit line A8, thereby allowing operation as a half SAM device. An appropriate load (not shown) may exist between Vcc and Vss when the fuse is intact to prevent the power source from being short circuited when transistors 106, 108 turn Referring to FIGS. 9A to 9C, the address pin switching control circuit 100 can be embodied without using a fuse. FIG. 9A shows the detailed address pin switching control circuit 100 according to a different embodiment of the present invention. In this structure, a load transistor 132 as a switching transistor has a channel connected between the power supply voltage Vcc and a connection node 134. A driving signal B is provided to a gate of the load transistor 132. Furthermore, driving transistors 136 and 138 are connected in parallel to each other between the connection node 134 and the ground Vss to provide current paths to the ground Vss for discharging the voltage charged at the connection node 104. A driving signal C is provided to a gate of the driving transistor 136 and a driving signal D is provided to a gate of the driving transistor 138. Meanwhile, the connection node 134 is connected to an input of inverter 140 and an output of inverter 142, which are connected serially to each other. Furthermore, the connection node 134 is connected to the input of an inverter 144 of which an output signal corresponds to the output of the address pin switching control circuit 100. Under such a circuit structure, the video RAM device has the structure of either a full SAM device or a half SAM device according to the level of the driving signal B. That is, the signal B goes to a "high" state to cause the signal output of the inverter 144 to go to the "high" state so that the video RAM device operates as a full SAM device because the switching transistors 32 and 34 are turned on. On the contrary, for operation as a half SAM device, the signal output of the inverter 144 goes to the "low" state in response to signal B having a short pulse to the "low" level, so that the switching transistors 36 and 38 for the half SAM device are turned on to perform the operation as a half SAM device. A signal C of a "high" level is output upon power-up of the video RAM device, and signal D having a "high" level is generated about 10 ns after the driving signal B to the "low" state is generated, during a normal operation mode of the video RAM device.

Figure 9B:
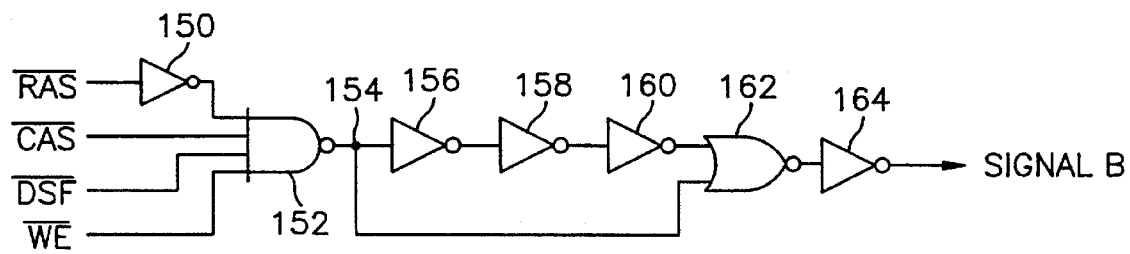
FIG. 9B is a circuit for generating a driving signal B shown in FIG. 9A.

FIG. 9B is a circuit for generating the driving signal B. The circuit is composed of a NAND gate 152 which receives the row address strobe signal $\overline{RAS}$ through an inverter 150, a column address strobe signal $\overline{CAS}$, a signal $\overline{DSF}$ for use in the split transfer operation, and a write enable signal $\overline{WE}$. A connection node 154 is connected to the output of the NAND gate 152, and inverters 156, 158, and 160 are connected in series to the connection node 154. A NOR gate 162 receives a signal output of the NAND gate 152 and a signal output from the serial inverter chain by the inverter 160. An inverter 164 is connected to the output of the NOR gate 162 and provides the driving signal B.

Figure 9C:
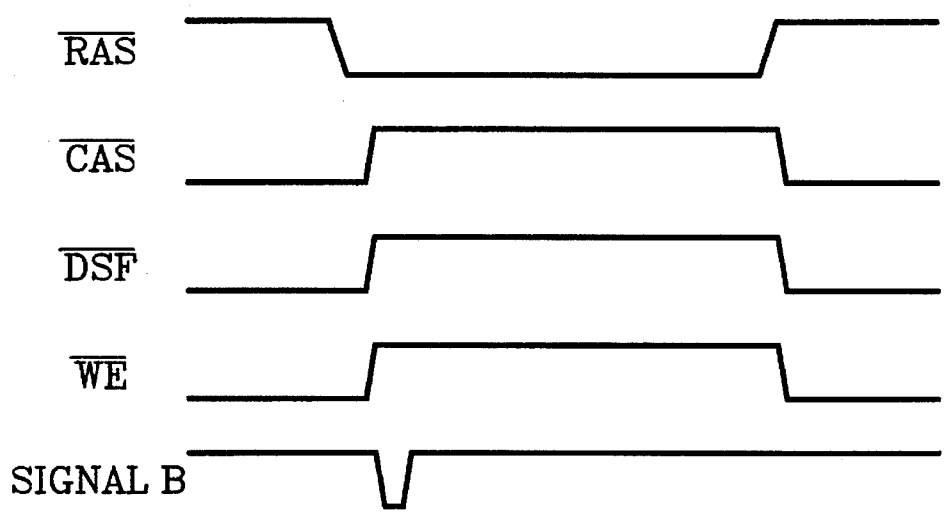
FIG. 9C is an operating timing diagram of the circuit shown in FIG. 9B.

FIG. 9C is an operation timing diagram of the circuit of FIG. 9B, and shows the condition of the signal inputs $\overline{RAS}$, $\overline{CAS}$, $\overline{DSF}$, and $\overline{WE}$ required to generate the driving signal B having a short pulse to the "low" level. Other operations are the same as explained above.

The embodiment of FIGS. 3 to 5, and the embodiment of FIGS. 6 to 9C are the preferred embodiments of the present invention. However, the preferred embodiments can be differently implemented, for example, by changing the control signals and the signal inputs in the present invention. For instance, a different normally "high" signal can be substituted for the $\overline{RAS}$ signal as shown in FIGS. 8B and 8C with the same results, and the same is true for signals $\overline{RAS}$, $\overline{CAS}$, $\overline{DSF}$, and $\overline{WE}$ in the embodiment of FIG. 9A–9C. Depending upon the signals used, inverters 150 such as that used to invert $\overline{RAS}$ in the circuit of FIG. 9C may or may not be necessary.

As described above, a video RAM device according to the present invention is compatible with video systems irrespective of the type of video RAM controller used in the system. The video RAM device is freely changeable to operate as either a half SAM device or as a full SAM device to conform to the type of video RAM controller used, depending upon an internal addressing condition. This allows for a single design of a video RAM device to operate as either a full SAM device or a half SAM device. Thus, the cost and time for design and manufacturing video systems using a video RAM device according to the present invention can be drastically reduced.

While the invention has been particularly shown and described with reference to the preferred embodiments, it will be understood by those skilled in the art that modifications to the details may be made or similar circuits made but with different components than those shown as an example without departing from the spirit and scope of the invention.

What is claimed is:

1. In a video random access memory device that can be connected during manufacture to operate as one of a full serial access memory device and a half serial access memory device, the device comprising: a serial access memory comprising:
- a first interleaved group of serial access memory cells, each transferring data with a respective cell of said random access memory accessed when a first most significant bit of an accessing address signal has a first logic level, and
- a second interleaved group of serial access memory cells, each transferring data with a respective cell of said random access memory when said first most significant bit of said accessing address signal has a second logic level, said second interleaved group of serial access memory cells being interleaved with said first interleaved group of serial access memory cells with respect to a serial output sequence of data stored in said serial access memory; and connection means, alterable during manufacture of said device, for configuring said video random access memory device to operate as one of a full serial access memory device and a half serial access memory device.

2. In a video random access memory device according to claim 1, wherein said accessing address is a column address.

3. In a video random access memory device according to claim 1, wherein said first logic level is complementary to said second logic level.

4. In a video random access memory device according to claim 1, said video random access memory device further comprising:
- a first group of transfer gates connected to said first interleaved group of serial access memory cells and alterably connected to a first control line, a signal on said first control line activating ones of said first group of transfer gates connected to said first control line; and
- a second group of transfer gates connected to said second interleaved group of serial access memory cells and alterably connected to a second control line, a signal on said second control line activating ones of said second group of transfer gates connected to said second control line.

5. In a video random access memory device according to claim 1, said video random access memory device further comprising:
- a random access memory comprising:
  - a first interleaved group of random access memory cells, each being accessed when said first most significant bit of said accessing address signal has a first logic level, and
  - a second interleaved group of random access memory cells, each being accessed when said first most significant bit of said accessing address signal has a second logic level, said second interleaved group of random access memory cells being interleaved with said first interleaved group of random access memory cells with respect to a serial output sequence of data stored in said serial access memory.

6. In a video random access memory device according to claim 1, said video random access memory device further comprising:
- a serial counter generating serial addresses for addressing said serial access memory.

7. In a video random access memory device according to claim 1, said video random access memory device further comprising:
- a first group of transfer gates connected to said first interleaved group of serial access memory cells and alterably connected to a first control line, a signal on said first control line activating ones of said first group of transfer gates connected to said first control line; and
- a second group of transfer gates connected to said second interleaved group of serial access memory cells and alterably connected to a second control line, a signal on said second control line activating ones of said second group of transfer gates connected to said second control line;

said connection means choosably disconnecting said first group of transfer gates from said second control line and choosably disconnecting said second group of transfer gates from said first control line.

8. A video random access memory device that can be connected during manufacture to operate as one of a full serial access memory and a half serial access memory device, the device comprising:
- a serial access memory comprising:
  - a first interleaved group of serial access memory cells, each transferring data with a respective cell of said random access memory accessed when a first most significant bit of an accessing address signal has a first logic level, and
  - a second interleaved group of serial access memory cells, each transferring data with a respective cell of said random access memory accessed when said first most significant bit of said accessing address signal has a second logic level, said second interleaved group of serial access memory cells being interleaved with said first interleaved group of serial access memory cells with respect to a serial output sequence of data stored in said serial access memory;
- a random access memory comprising:
  - a first interleaved group of random access memory cells, each being accessed when said first most significant bit of said accessing address signal has said first logic level, and
  - a second interleaved group of random access memory cells, each being accessed when said first most significant bit of said accessing address signal has said second logic level, said second interleaved group of random access memory cells being interleaved with said first interleaved group of random access memory cells with respect to said serial output sequence of data stored in said serial access memory;
- connection means, alterable during manufacture of said device, for configuring said video random access memory device to operate as one of a full serial access memory device and a half serial access memory device;
- a plurality of transfer gates for transferring data between said first and second interleaved groups of random access memory and said first and second interleaved groups of serial access memory; and
- a serial counter generating serial addresses for addressing said serial access memory.

9. A video random access memory device according to claim 8, wherein accessing address is a column address.

10. A video random access memory device according to claim 8, wherein said first logic level is complementary to said second logic level.

11. A video random access memory device according to claim 8, wherein said plurality of transfer gates comprises:
- a first group of transfer gates connected to said first interleaved group of serial access memory cells and alterably connected to a first control line, a signal on said first control line activating ones of said first group of transfer gates connected to said first control line; and a second group of transfer gates connected to said second interleaved group of serial access memory cells and alterably connected to a second control line, a signal on said second control line activating ones of said second group of transfer gates connected to said second control line;

said connection means for alterably disconnecting said first group of transfer gates from said second control line and choosably disconnecting said second group of transfer gates from said first control line.

12. A video random access memory device according to claim 8, wherein:

said serial counter generates addresses accessing both said first and second interleaved group of serial access memory cells when said connection means is altered to configure said video random access memory device to operate as said full serial access memory device; and said serial counter generates addresses accessing only one of said first and second interleaved group of serial access memory cells when said connection means is altered to configure said video random access memory device to operate as said half serial access memory device.

13. In a video random access memory device that can be connected during manufacture to operate as one of a full serial access memory device and a half serial access memory device, the device comprising:

a random access memory;

a serial access memory receiving data transferred from said random access memory; and address switching control means connected to said random access memory for switchably exchanging connections between a first address bit and a second address bit of an external address signal external to said video random access memory device and respective internal address bits of an internal address signal addressing said random access memory, said exchange of said connections changing said serial access memory between operation as a full serial access memory and operation as a half serial access memory.

14. In a video random access memory device according to claim 13, wherein said internal address signals are column address signals.

15. In a video random access memory device according to claim 13, said address switching control means comprising:

a first address bit input terminal for receiving a first address bit of said external address signal;

a second address bit input terminal for receiving a second address bit of said external address signal;

a first address bit input buffer for receiving said first address bit;

a second address bit input buffer for receiving said second address bit;

first current paths formed between said first address bit input terminal and said first address bit input buffer, and between said second address bit input terminal and said second address bit input buffer; and second current paths formed between said first address bit input terminal and said second address bit input buffer, and between said second address bit input terminal and said first address bit input buffer;

wherein said address switching control means switches between said first and second current paths and thereby respectively changes said serial access memory between operation as a full serial access memory and operation as a half serial access memory.

16. In a video random access memory device according to claim 15, wherein said internal address signals are column address signals.

17. In a video random access memory device according to claim 15, wherein said first and second current paths each comprise a MOS transistor.

\* \* \* \* \*